United States Patent
Teranishi et al.

(10) Patent No.: US 8,471,805 B2
(45) Date of Patent: Jun. 25, 2013

(54) IMAGING DEVICE, DRIVING METHOD OF THE SAME, DISPLAY DEVICE AND ELECTRONIC APPARATUS

(75) Inventors: Yasuyuki Teranishi, Kanagawa (JP); Yoshiharu Nakajima, Kanagawa (JP); Masafumi Matsui, Kanagawa (JP)

(73) Assignee: Japan Display West Inc., Aichi-ken (JP)

( * ) Notice: Subject to any disclaimer, the term of this patent is extended or adjusted under 35 U.S.C. 154(b) by 947 days.

(21) Appl. No.: 12/226,898

(22) PCT Filed: May 8, 2007

(86) PCT No.: PCT/JP2007/059516
§ 371 (c)(1),
(2), (4) Date: Oct. 31, 2008

(87) PCT Pub. No.: WO2007/132699
PCT Pub. Date: Nov. 22, 2007

(65) Prior Publication Data
US 2009/0219277 A1 Sep. 3, 2009

(30) Foreign Application Priority Data

May 15, 2006 (JP) .................................. 2006-134674
Apr. 25, 2007 (JP) .................................. 2007-115037

(51) Int. Cl.
*G09G 3/36* (2006.01)
(52) U.S. Cl.
USPC ............... 345/100; 345/87; 345/98; 345/204; 345/211; 345/690

(58) Field of Classification Search
USPC ... 345/55, 87–100, 211–214, 690; 250/208.1; 348/296, 301–308
See application file for complete search history.

(56) References Cited

U.S. PATENT DOCUMENTS

| 5,122,881 A * | 6/1992 | Nishizawa et al. ............ 348/301 |
| 6,115,066 A * | 9/2000 | Gowda et al. .................. 348/308 |

(Continued)

FOREIGN PATENT DOCUMENTS

| JP | 05-122624 | 5/1993 |
| JP | 05-252344 | 9/1993 |

(Continued)

OTHER PUBLICATIONS

Japanese Office Action issued Oct. 11, 2011 for corresponding Japanese Application No. 2007-115037.

(Continued)

*Primary Examiner* — Quan-Zhen Wang
*Assistant Examiner* — Jennifer Nguyen
(74) *Attorney, Agent, or Firm* — Rader, Fishman & Grauer PLLC

(57) ABSTRACT

In an imaging device including imaging elements, a driver configuration which does not require much layout space and ensures a reduced number of wirings is provided. The imaging device includes imaging elements 1 arranged in a matrix or in lines and a single driver circuit 6 disposed along the vertical direction of the matrix or along the direction in which the lines extend to control the driving of the imaging elements 1. Then, the driver circuit 6 serves the double function of a reset driver adapted to reset the imaging elements and a read driver adapted to read out the signals from the imaging elements.

14 Claims, 14 Drawing Sheets

U.S. PATENT DOCUMENTS

| | | | |
|---|---|---|---|
| 6,999,120 B1* | 2/2006 | Egawa et al. | 348/296 |
| 2005/0264666 A1* | 12/2005 | Iwasawa et al. | 348/308 |
| 2006/0208158 A1* | 9/2006 | Masashi | 250/208.1 |

FOREIGN PATENT DOCUMENTS

| | | |
|---|---|---|
| JP | 06-334920 | 12/1994 |
| JP | 11-122532 | 4/1999 |
| JP | 11-274451 | 10/1999 |
| JP | 2002-314756 | 10/2002 |
| JP | 2002-354343 | 12/2002 |
| JP | 2003-110940 | 4/2003 |
| JP | 2003-134396 | 5/2003 |
| JP | 2004-153327 | 5/2004 |
| JP | 2004-318067 | 11/2004 |
| JP | 2006-043293 | 2/2006 |

OTHER PUBLICATIONS

European Search Report issued Jun. 15, 2012 for corresponding European Application No. 07 74 2951.

European Patent Office Communication Pursuant to Article 94(3) EPC issued Jun. 26, 2012 for corresponding European Application No. 07 742 951.02.

* cited by examiner

IMAGING DEVICE, DRIVING METHOD OF THE SAME, DISPLAY DEVICE AND ELECTRONIC APPARATUS

TECHNICAL FIELD

The present invention relates to an imaging device having imaging elements, a driving method of the same, a display device and an electronic apparatus.

BACKGROUND ART

Typically, optoelectric conversion elements such as a CCD (Charge Coupled Devices) sensor, a CMOS (Complementary Metal Oxide Semiconductor) sensor and the like are widely known as imaging elements adapted to capture an image. In recent years, a combination of a thin film transistor (hereinafter abbreviated as "TFT"), capacitor and other components has been proposed to function as an optoelectric conversion element. An example thereof is, for example, a display device which includes liquid crystal display elements, the TFT adapted to function as an optoelectric conversion element and other components in each of pixels arranged in a matrix. The display device further includes a backlight or frontlight as a light source and displays an image by transmitting light from the light source through the liquid crystal display elements. On the other hand, the display device permits entry of information using incident light onto the TFT (refer, for example, to Japanese Patent Laid-Open No. 2002-268615). The display device configured as described above allows for image display and information entry on the same screen region. Therefore, such a display device is expected to find application as an information input/output device to replace a touch panel and other devices.

Incidentally, if the TFTs or other components adapted to function as optoelectric conversion elements are arranged in a matrix, driver circuits as shown, for example, in FIG. 10, are required to control the driving of each of the TFTs or other components. That is, a reset driver 112, read driver 113 and source voltage driver 114 need to be provided for a sensor group 111, in which TFTs or other components are arranged in a matrix, as vertical drivers disposed along the vertical direction of the matrix. The reset driver 112 resets the charge stored condition of the sensor group 111. The read driver 113 reads out the stored charge. The source voltage driver 114 controls the applied voltage. Further, a horizontal driver 115 is also required along the horizontal direction of the matrix. Of these drivers, the reset driver 112 includes shift registers to be associated with the lines in the matrix arrangement as illustrated in FIG. 11. The reset driver 112 sequentially performs a reset operation on each of the lines in response to a reset signal (ResetVST) from a higher-level circuit (not shown) as a trigger. Also, similarly, the read driver 113 sequentially performs a signal read out operation from each of the lines in response to a read signal (ReadVST) from the higher-level circuit as a trigger. Then, as illustrated in FIG. 12, after the reset operation is performed sequentially by the reset driver 112 on each of the lines of the sensor group 111 in response to the reset signal (ResetVST), the read driver 113 sequentially performs a signal read out operation upon receipt of the read signal (ReadVST) to read out the charge stored in the sensor group 111 after the reset.

However, the above-mentioned conventional driver circuit configuration requires the plurality of driver circuits 112, 113 and so on as vertical drivers. Therefore, the configuration is not preferred for the following reasons. That is, the plurality of driver circuits 112, 113 and so on require a large layout space. This may lead to a larger so-called frame region around the effective screen region. Further, the plurality of driver circuits 112, 113 and so on lead to more wirings. This may make it difficult to secure an opening area in each pixel. Further, for example, if the plurality of driver circuits 112, 113 and so on are disposed on one side of the sensor group 111, there is a need to provide wirings so that the wirings straddle at least one of the driver circuits. This may result in extremely low layout efficiency.

In light of the foregoing, it is an object of the present invention to provide an imaging device capable of realizing a driver configuration which does not require much layout space, ensures a reduced number of wirings and prevents wirings from straddling any of the driver circuits, and a driving method of the same, display device and electronic apparatus.

DISCLOSURE OF INVENTION

The present invention is an imaging device devised to achieve the above object. The imaging device is characterized in that the imaging device includes imaging elements and a single driver circuit. The imaging elements are arranged in a matrix or in lines. The driver circuit is disposed along the vertical direction of the matrix or along the direction in which the lines extend to control the driving of the imaging elements. The driver circuit serves the double function of a reset driver adapted to reset the imaging elements and a read driver adapted to read out the signals from the imaging elements.

In the imaging device configured as described above, a single driver circuit serves the double function of a reset driver and a read driver. Therefore, the conventionally separate driver circuits can be combined into a single circuit.

As described above, the present invention combines the driver circuits into a single circuit, thus ensuring reduced layout space over the conventional imaging devices. This contributes to reduced frame region. Further, the present invention uses fewer control signals and thus has fewer wirings. Still further, the driver circuits in the frame region on one side can be combined into a single circuit. This eliminates the need to provide wirings which straddle the driver circuits, thus ensuring high layout efficiency.

BEST MODE FOR CARRYING OUT THE INVENTION

A description will be given below of an imaging device, a driving method of the same, a display device and an electronic apparatus according to the present invention with reference to the drawings.

Figure 1:
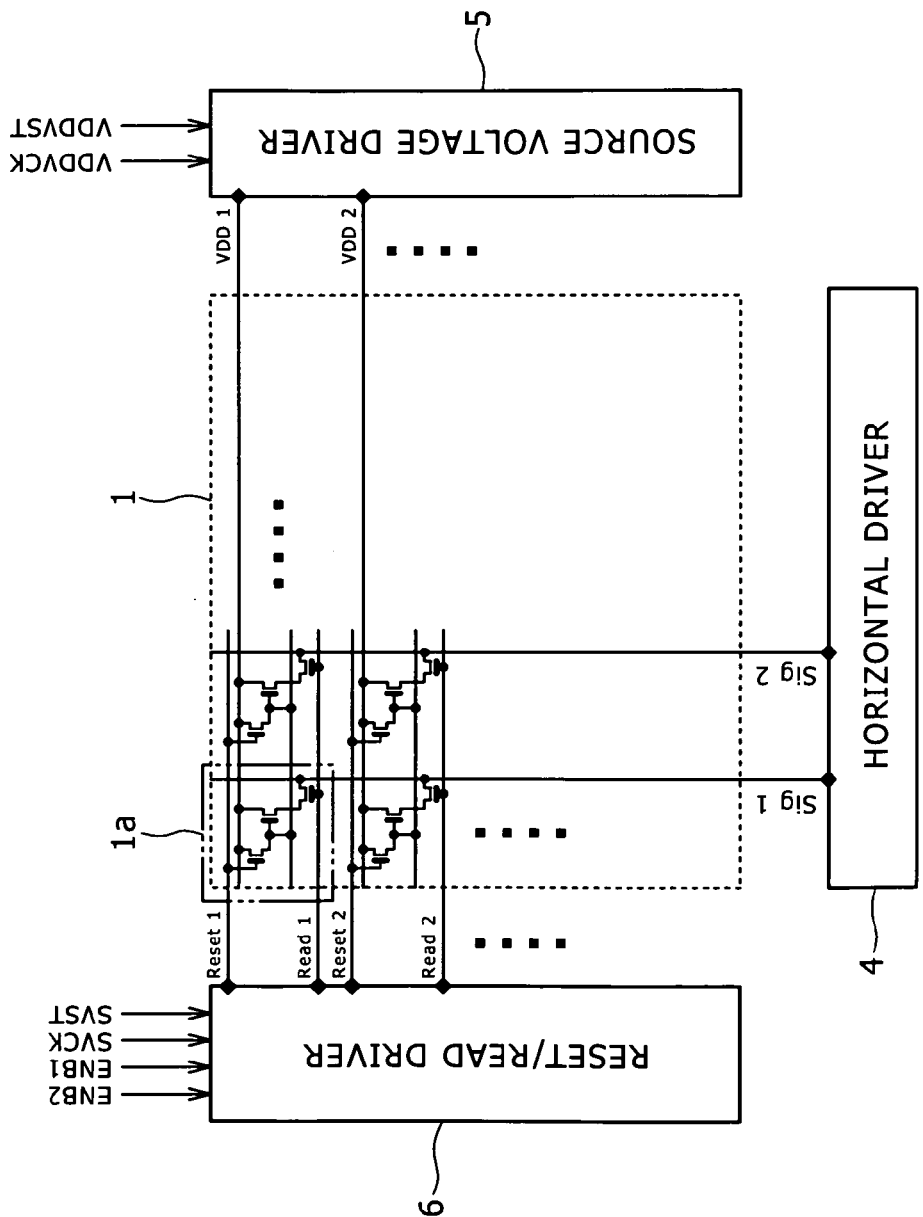
FIG. 1 is a circuit diagram illustrating an example of the schematic configuration of an imaging device according to the present invention.
Figure 2:
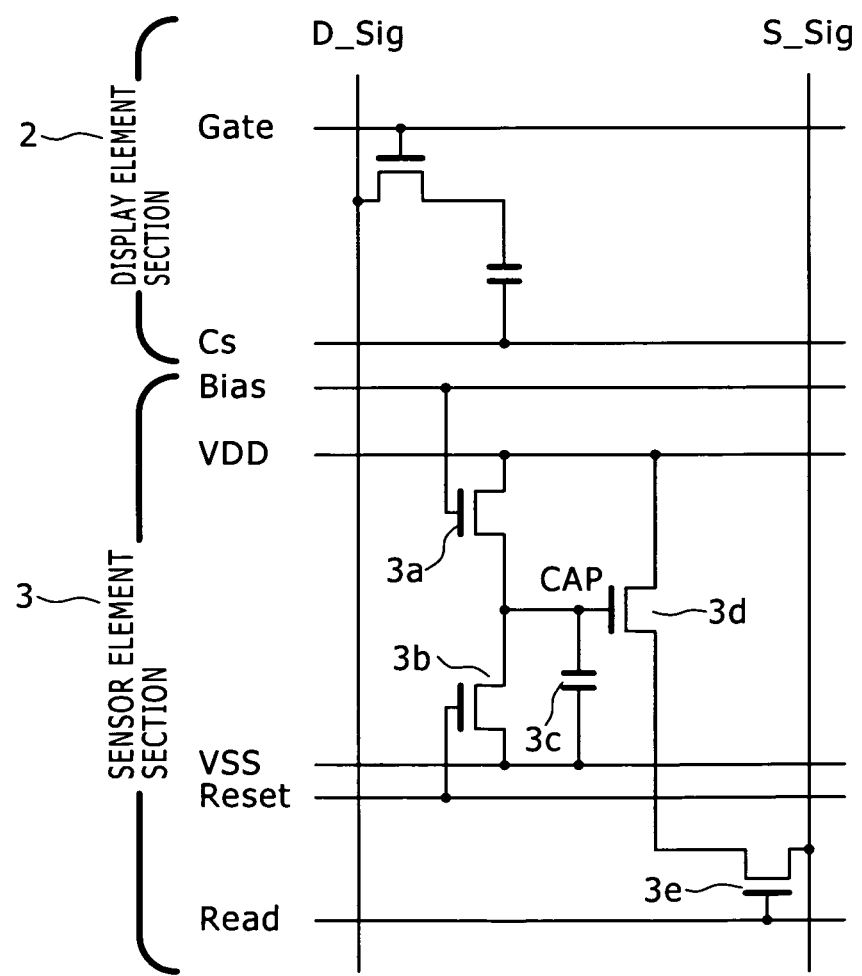
FIG. 2 is a circuit diagram illustrating an example of the major components included in the imaging device according to the present invention.
Figure 3:
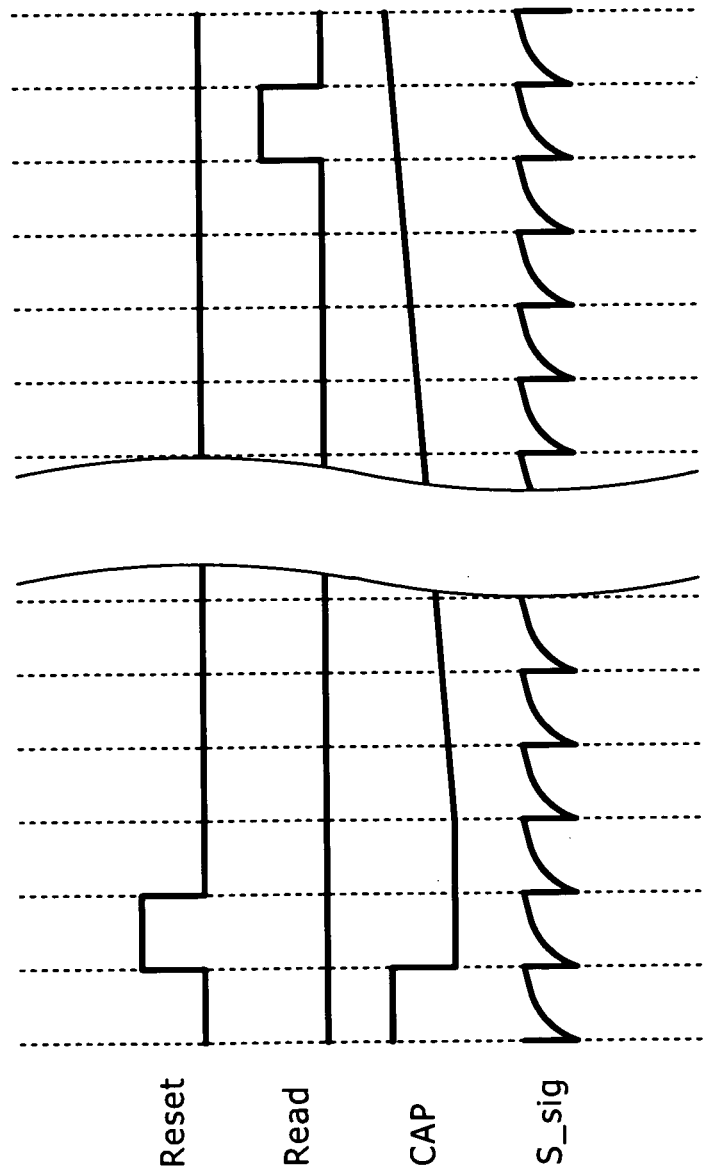
FIG. 3 is a timing chart illustrating an example of the operation of the major components of the imaging device according to the present invention.

The schematic configuration of the imaging device according to the present invention will be described first. FIG. 1 is a circuit diagram illustrating an example of the schematic configuration of the imaging device according to the present invention. FIG. 2 is a circuit diagram illustrating an example of the major components included in the imaging device. FIG. 3 is a timing chart illustrating an example of the operation of the major components.

The imaging device described in the present embodiment includes a sensor group 1 as illustrated in FIG. 1. The sensor group 1 includes a plurality of pixel sections 1a arranged in a matrix. The sensor group 1 is configured to permit information entry using incident light on one hand and image display on the other hand. That is, the imaging device also functions as a display device.

Therefore, each of the pixel sections 1a includes a display element section 2 and sensor element section 3 as illustrated in FIG. 2.

The display element section 2 is intended to achieve the functions of so-called low-temperature polysilicon liquid crystal. More specifically, the display section 2 includes a liquid crystal display element formed on a polycrystalline silicon (polysilicon) substrate. The liquid crystal display element selectively transmits light from a light source (backlight or frontlight) to display an image. It should be noted that the details of low-temperature polysilicon liquid crystal are publicly known. Therefore, the description thereof will be omitted in the present specification. Polycrystalline silicon conducts electricity more easily than amorphous silicon. This contributes to a higher liquid crystal response speed. Further, the transistors used to control the liquid crystal can be reduced in size. This contributes to a higher brightness thanks to increased opening area.

The sensor element section 3 includes a sensor transistor (hereinafter abbreviated as "Tr") 3a, reset Tr3b, capacitor 3c, source follower circuit 3d and read Tr3e formed on a low-temperature polysilicon substrate. Then, as illustrated in FIG. 3, after charges of the capacitor 3c are discharged to its initial state as the same capacitor 3c is reset by the reset Tr3b, a leakage current of the sensor Tr3a which changes with the light quantity received is charged into the capacitor 3c. Then, the voltage of the capacitor 3c produced by the amount of charge stored is impedance-converted by the source follower circuit 3d. After a given period of time, the read Tr3e is turned on to read out the sensor output to the signal line so that the sensor element section 3 functions as an optoelectric conversion element.

By forming, on a low-temperature polysilicon substrate, the sensor element section 3 which includes a combination of thin film transistors as described above, the sensor group 1 builds an integrated active pixel sensor array. The integrated active pixel sensor array includes the display element section 2 and sensor element section 3 for each of the pixel sections 1a on the same substrate.

A driver circuit controls the driving of the sensor group 1 configured as described above. That is, each of the components of the display element section 2 and sensor element section 3 in the sensor group 1 is connected to the driver circuit via the wirings extending respectively in the vertical and horizontal directions of the pixel matrix.

It should be noted, however, that the imaging device described in the present embodiment includes a horizontal driver 4, source voltage driver 5 and reset/read driver 6 as driver circuits as illustrated in FIG. 1 unlike conventional imaging devices. Of these drivers, the horizontal driver 4 is disposed along the horizontal direction of the pixel matrix of the sensor group 1. It should be noted that the horizontal driver 4 is the same as the conventional one. Therefore, the detailed description thereof will be omitted here. On the other hand, the source voltage driver 5 and reset/read driver 6 are disposed along the vertical direction of the pixel matrix of the sensor group 1. That is, these drivers function as the vertical drivers. It should be noted, however, that these drivers are disposed respectively on the different sides of the sensor group 1 and that the plurality of vertical drivers are not disposed on one side of the sensor group 1.

Of the driver circuits functioning as the vertical drivers, the source voltage driver 5 controls the supply of voltage applied to the components of the sensor element section 3 in each of the pixel sections 1a.

On the other hand, the reset/read driver 6 sequentially performs a reset operation by discharging the capacitor 3c to its initial state line by line in the matrix arrangement. The reset/read driver 6 also performs a signal read out operation by reading out the voltage of the capacitor 3c produced by the amount of charge stored in the capacitor 3c as a sensor output. That is, the reset/read driver 6 serves the double function of a reset driver adapted to reset the sensor element section 3 and a read driver adapted to read out the signals from the sensor element section 3.

Figure 4:
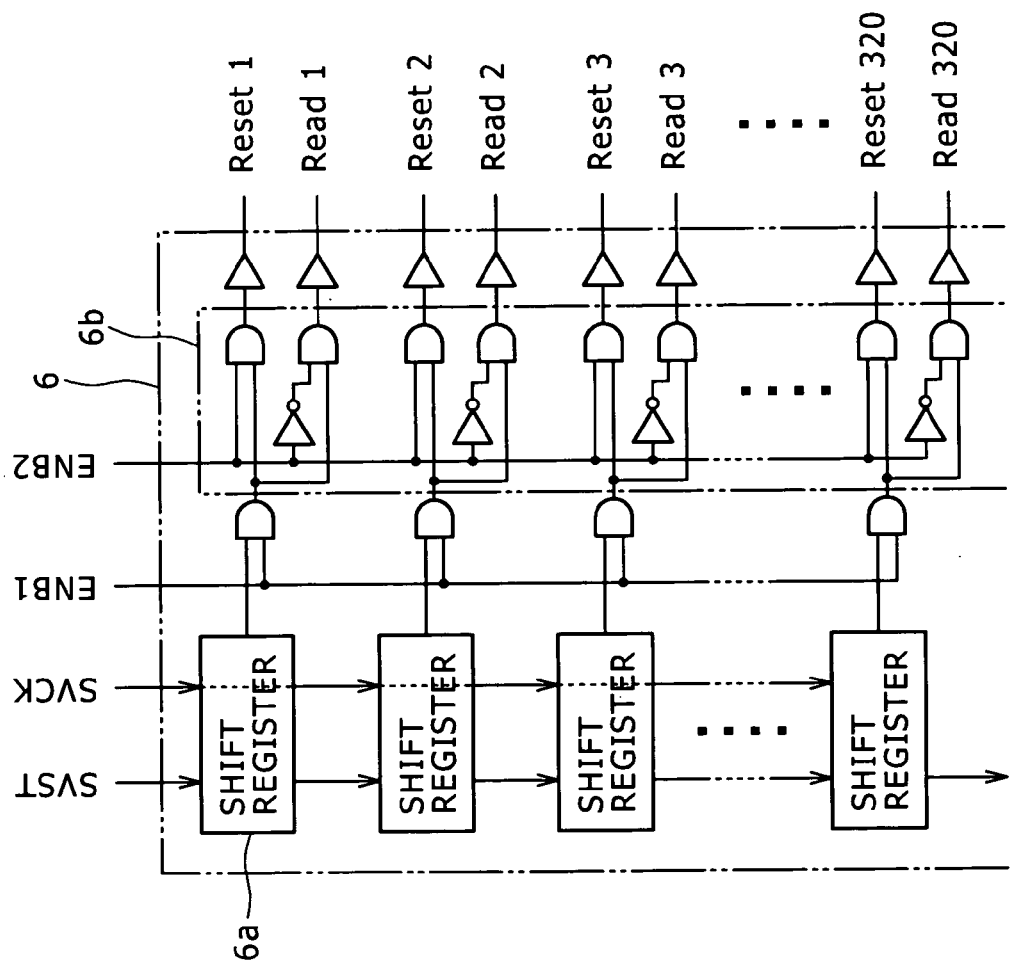
FIG. 4 is a circuit diagram illustrating the configuration of a reset/read driver in the imaging device according to the present invention.

Here, the reset/read driver 6 will be described further in detail. FIG. 4 is a circuit diagram illustrating an example of the configuration of the reset/read driver in the imaging device according to the present invention.

The reset/read driver 6 includes a plurality of shift registers 6a for the lines in the matrix arrangement of the sensor group 1, as with a conventional reset driver 12 and read driver 13

Figure 11:
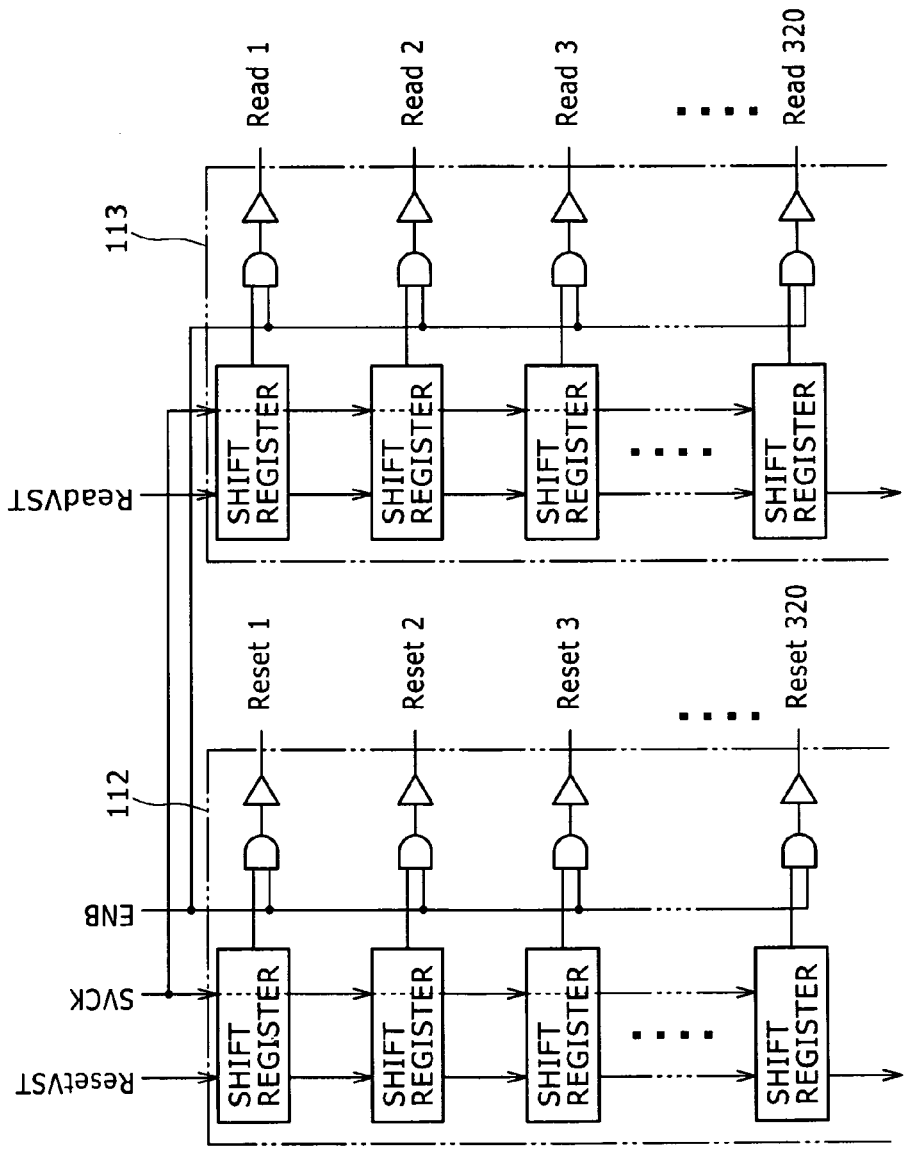
FIG. 11 is a circuit diagram illustrating an example of the major components included in the conventional imaging device.
Figure 12:
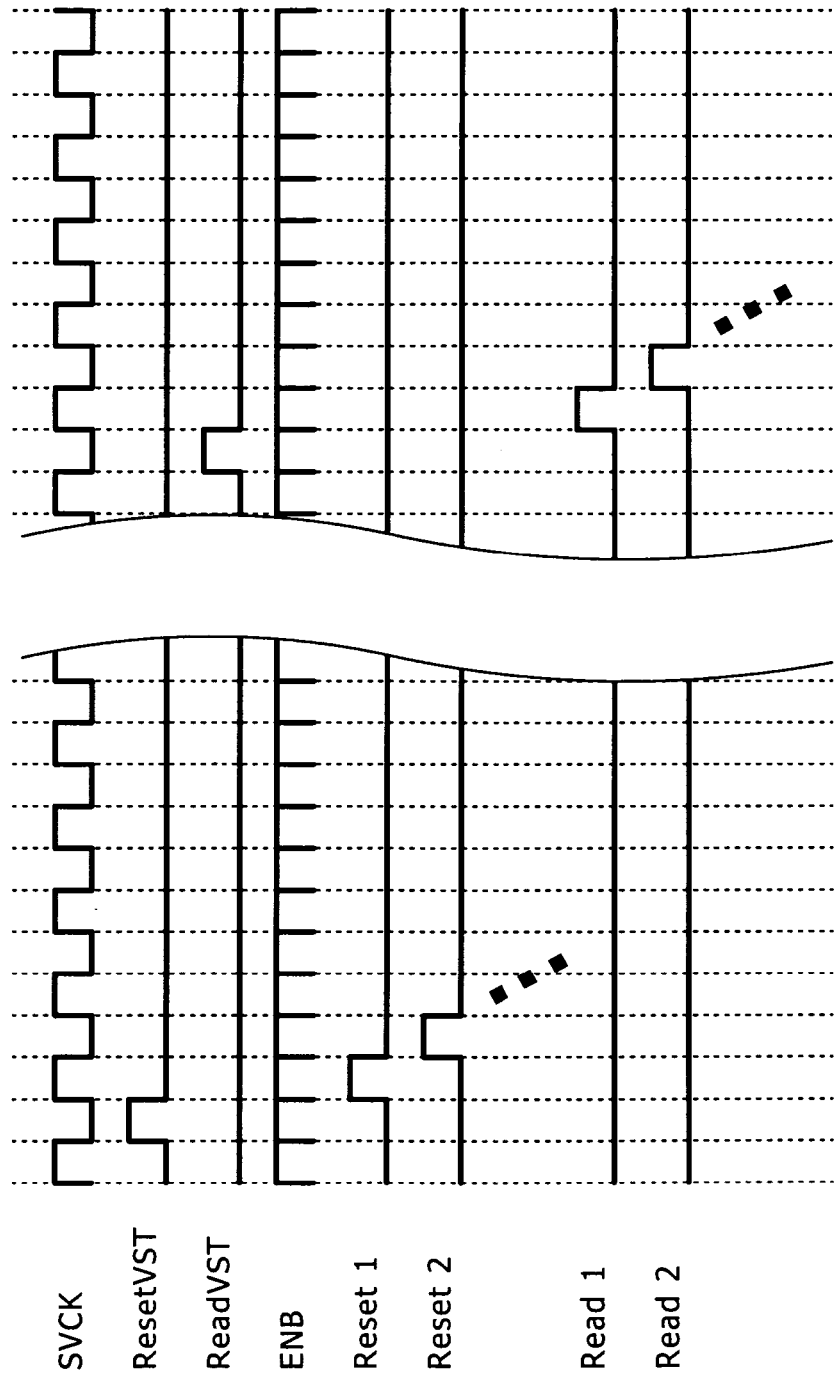
FIG. 12 is a timing chart illustrating an example of the operation of the conventional imaging device.

(refer to FIG. 11). It should be noted, however, that a start signal (SVST) is fed to the shift registers 6a from a higher-level circuit (not shown). The start signal need only correspond to the logical sum of the conventional reset signal (ResetVST) and conventional read signal (ReadVST). That is, the start signal can be generated based on the reset and read signals. It should be noted that the start signal may be generated by the higher-level circuit or reset/read driver 6.

Further, the reset/read driver 6 also includes selector circuits 6b provided to be associated with the plurality of shift registers 6a. The selector circuit 6b switches, according to a select signal (ENB2) from the higher-level circuit, the output signal from each of the shift registers 6a for use as a signal adapted to perform a reset operation on the sensor element section 3 in each of the pixel sections 1a or as a signal adapted to perform a signal read out operation from the sensor element section 3. It should be noted that the detailed configuration of the selector circuit 6b, i.e., the configuration adapted to switch the signal, may be realized using publicly known techniques such as a comparator and so on. Therefore, the description thereof will be omitted here.

As described above, the reset/read driver 6 can receive the start signal (SVST) serving as a trigger to initiate the operation and the select signal (ENB2) adapted to select the operation to be initiated. Upon receipt of the start signal, the reset/read driver 6 causes the sensor element section 3 in each of the pixel sections 1a to perform a reset operation or signal read out operation according to the select signal received at that moment. As a result, the reset/read driver 6 incorporates both functions as a reset driver and read driver in a single unit.

A description will be given next of the operation control procedure for the imaging device configured as described above, i.e., the driving method of the imaging device according to the present invention. It should be noted that control of the operation of the sensor element section 3 in each of the pixel sections 1a of the sensor group 1 will be primarily described here. Control of the operation of the display element section 2 need only be performed in the same manner as in the conventional imaging device. Therefore, the description thereof will be omitted.

Figure 5:
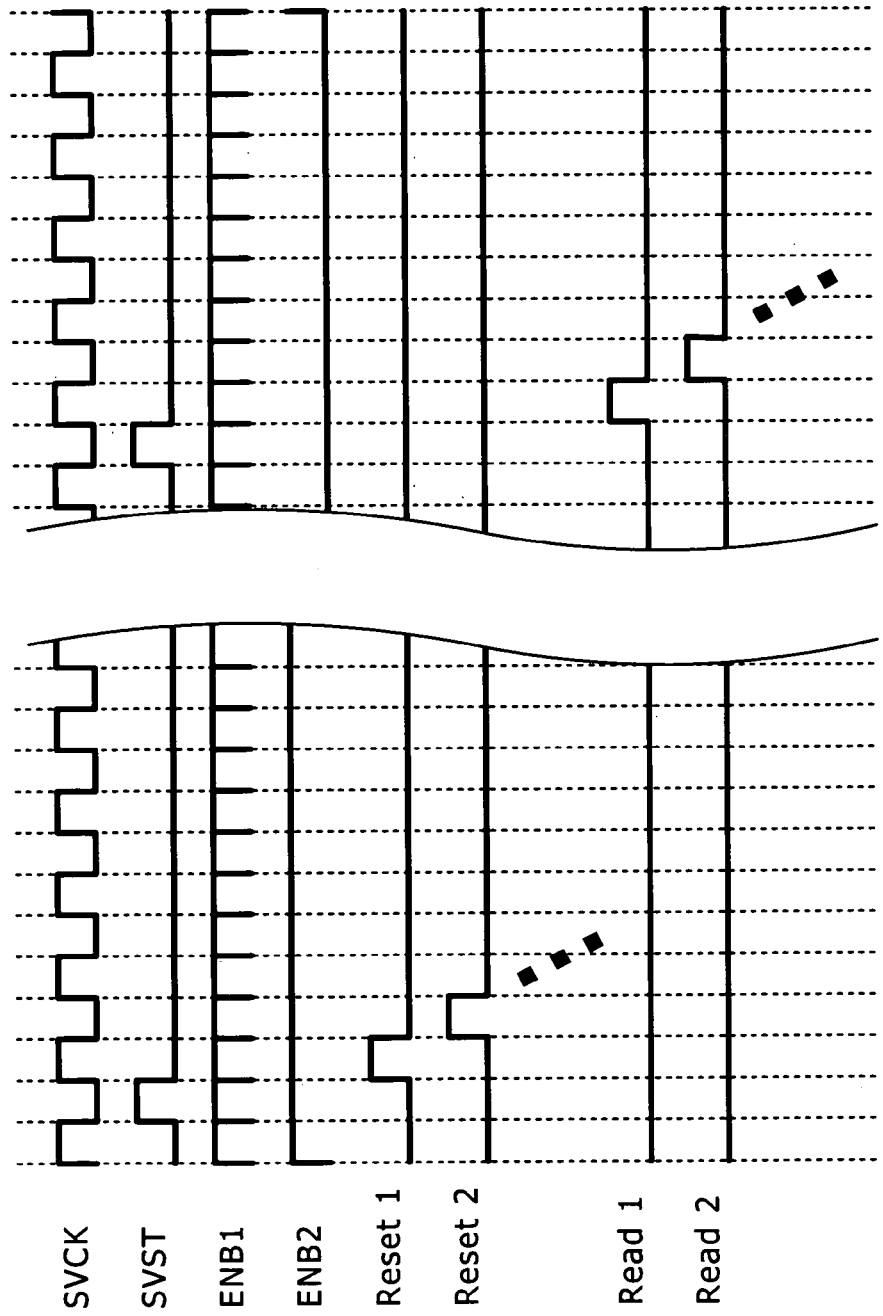
FIG. 5 is a timing chart illustrating an example of the driving procedure for a driving method of the imaging device according to the present invention.

FIG. 5 is a timing chart illustrating an example of the driving procedure for the driving method of the imaging device according to the present invention. As illustrated in FIG. 5, when supplied with the start signal (SVST) and select signal (ENB2) while operating in synchronism with a reference clock signal (SVCK) supplied from the higher-circuit, the reset/read driver 6 causes the sensor element section 3 in each of the pixel sections 1a to perform a reset operation or signal read operation in response to the start signal as a trigger. At this time, the reset/read driver 6 switches the operation to be initiated between the reset operation and signal read out operation according to the status of the select signal when the start signal is supplied. More specifically, the reset/read driver 6 initiates the reset operation if the select signal is in high (Hi) state. That is, the shift registers 6a output signals, delayed one from another, respectively to the lines in the pixel sections 1a arranged in a matrix in response to the start signal as a trigger, thus discharging the capacitor 3c of the sensor element section 3 in each of the pixel sections 1a to its initial state. On the other hand, the reset/read driver 6 initiates the signal read out operation if the select signal is in low (Low) state. That is, the shift registers 6a output signals, delayed one from another, respectively to the lines in the pixel sections 1a arranged in a matrix in response to the start signal as a trigger, thus reading out the voltage of the capacitor 3c.

As described above, according to the above-mentioned configured imaging device and driving method of the same, the reset/read driver 6, which is a single driver circuit, serves the double function of a reset driver and a read driver. This combines the conventionally separate driver circuits into a single circuit, thus ensuring reduced layout space over the conventional imaging devices. This contributes to reduced frame region. Further, the imaging device configured as describe above and driving method of the same use fewer control signals, and has fewer wirings. Still further, the driver circuits in the frame region on one side can be combined into a single circuit. This eliminates the need to provide wirings which straddle any of the driver circuits, thus ensuring high layout efficiency.

Moreover, the reset/read driver 6 receives the start signal serving as a trigger to initiate the operation and the select signal adapted to select the operation to be initiated. Further, upon receipt of the start signal, the reset/read driver 6 causes the sensor element section 3 in each of the pixel sections 1a to perform a reset operation or signal read out operation according to the select signal received at that moment. That is, selective operation makes it possible to combine the functions of a reset driver and read driver which are originally separate into a single unit. Even in that case, the number of signals required will not increase extremely in such a way as to complicate the system configuration.

Figure 6:
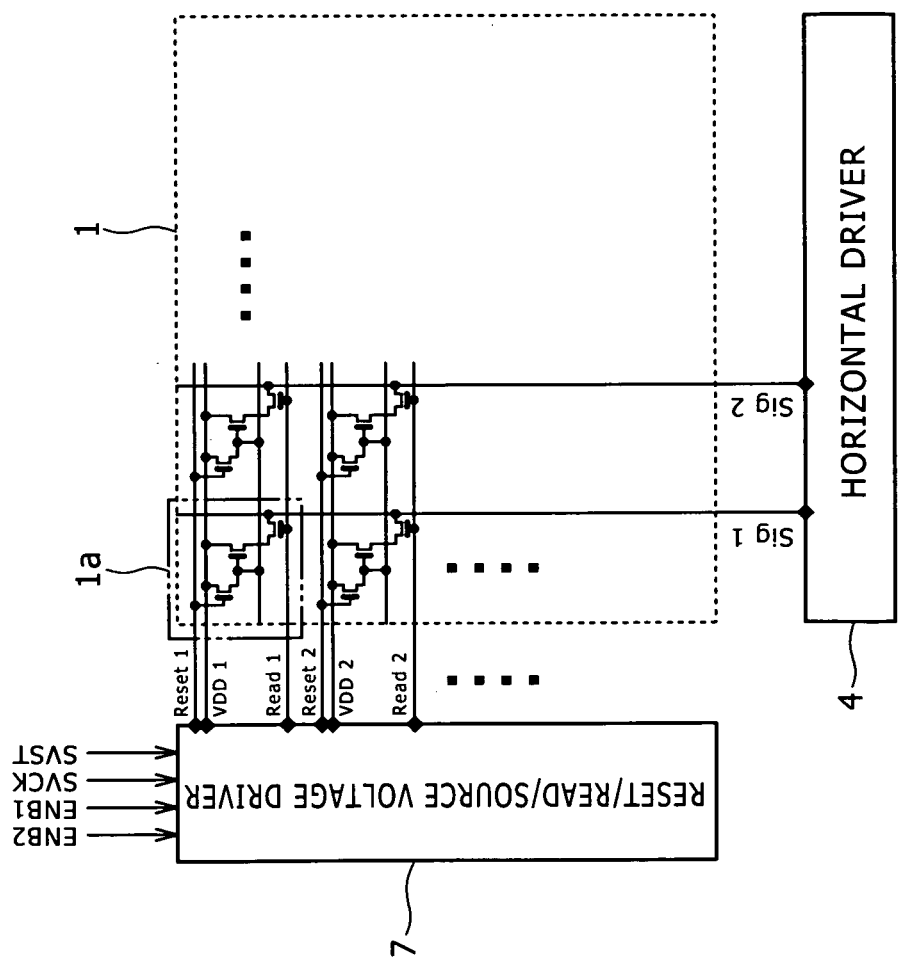
FIG. 6 is a circuit diagram illustrating an example of the schematic configuration of the imaging device according to another embodiment of the present invention.
Figure 7:
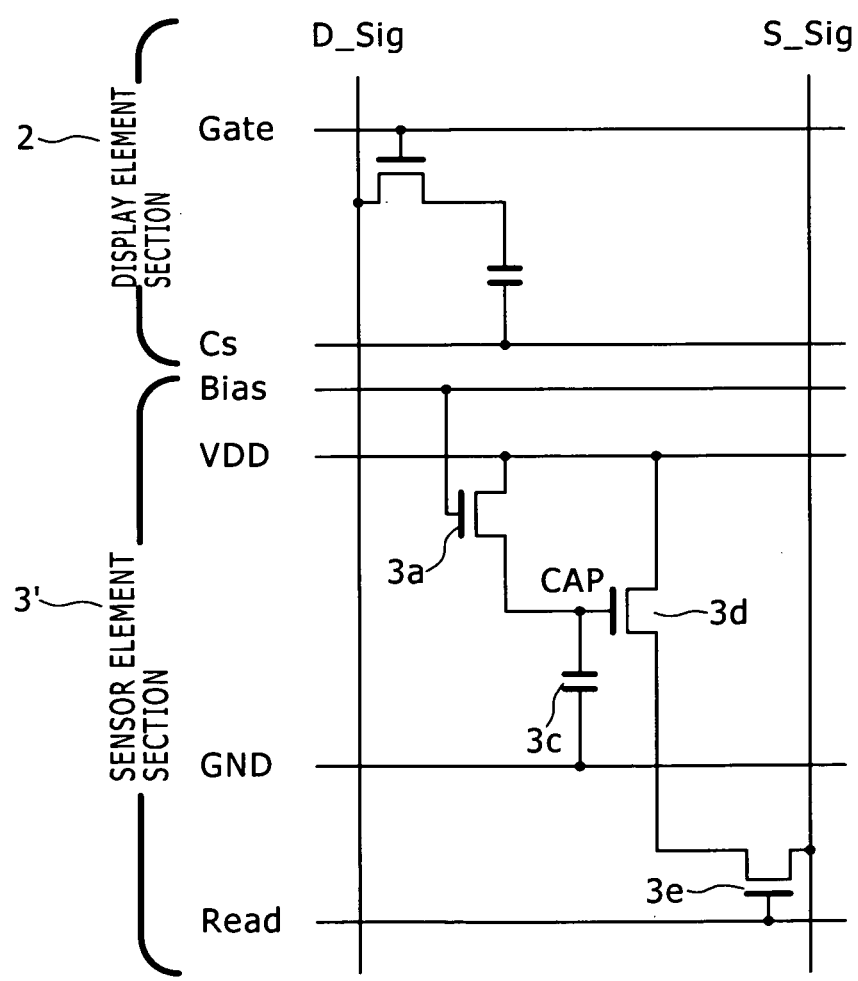
FIG. 7 is a circuit diagram (part 1) illustrating an example of major components included in the imaging device according to another embodiment of the present invention.
Figure 8:
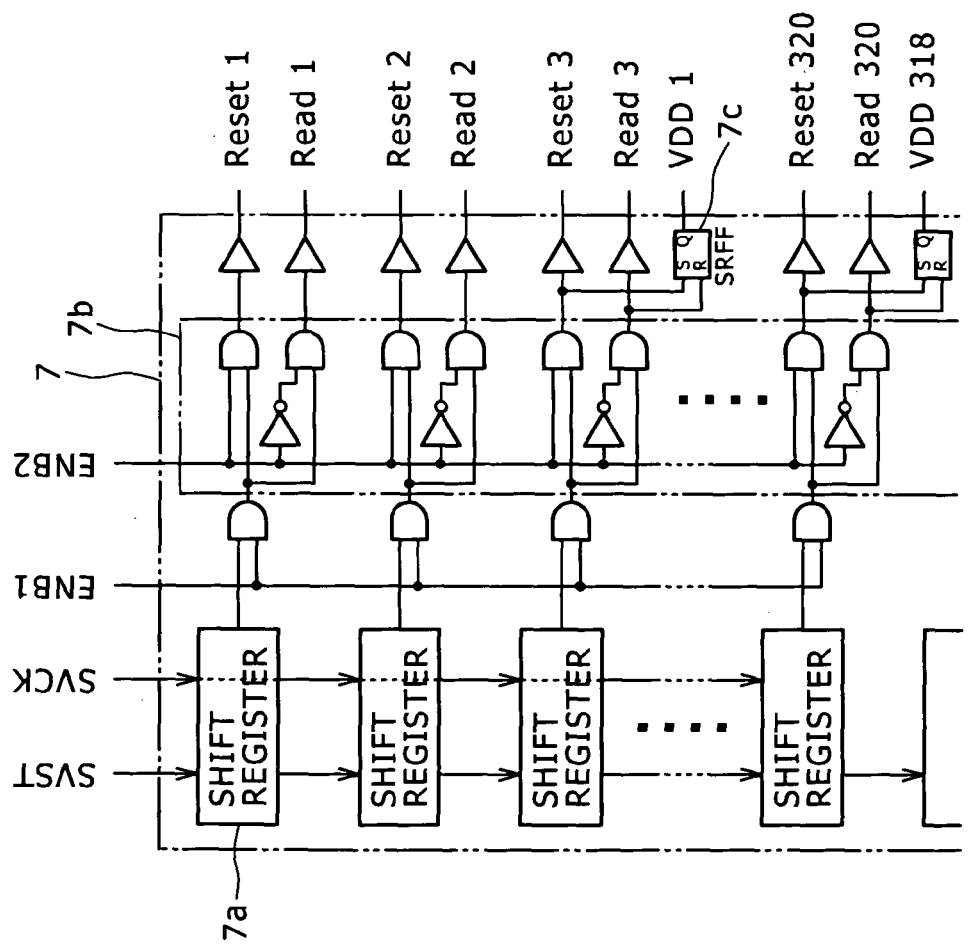
FIG. 8 is a circuit diagram (part 2) illustrating an example of major components included in the imaging device according to another embodiment of the present invention.
Figure 9:
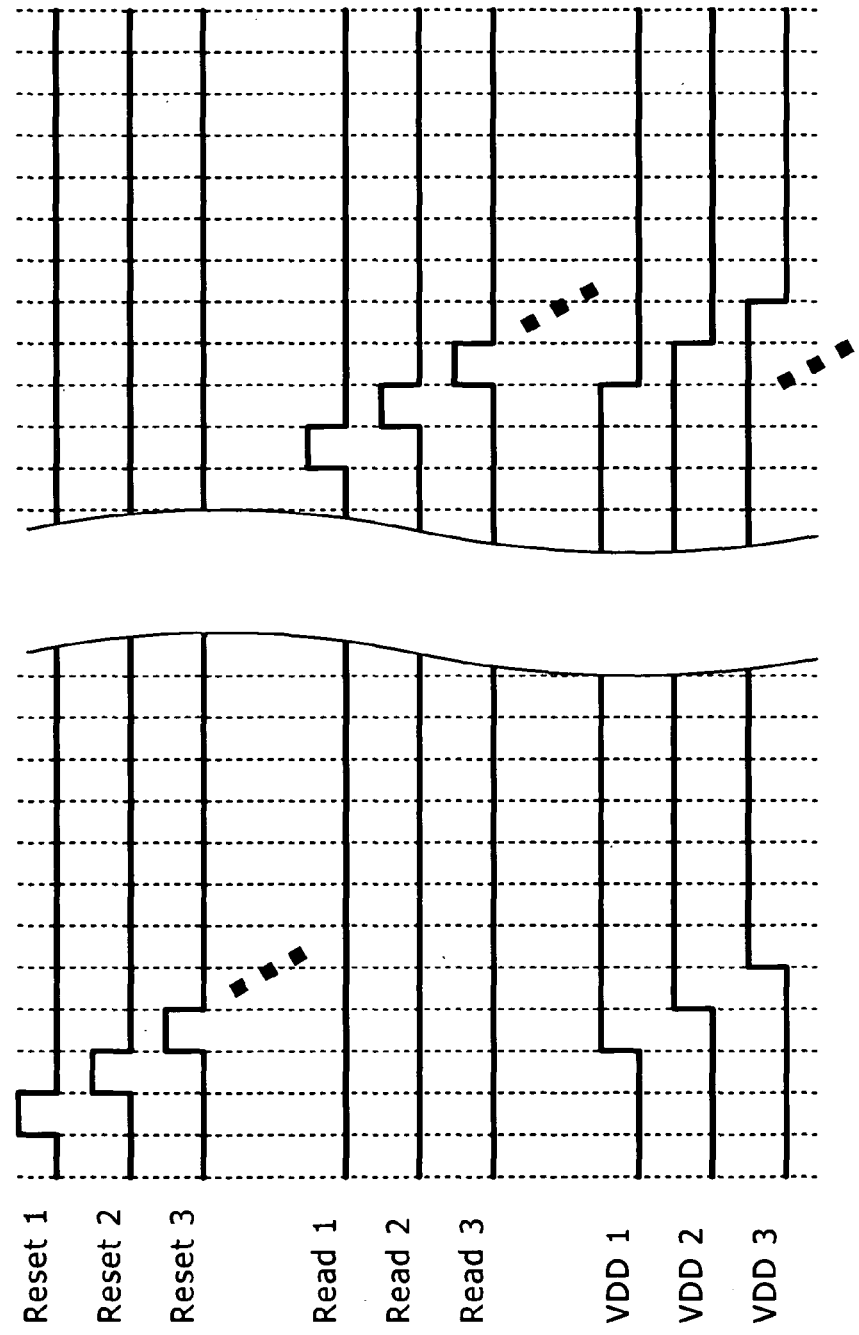
FIG. 9 is a timing chart illustrating an example of the operation of the imaging device according to another embodiment of the present invention.
Figure 10:
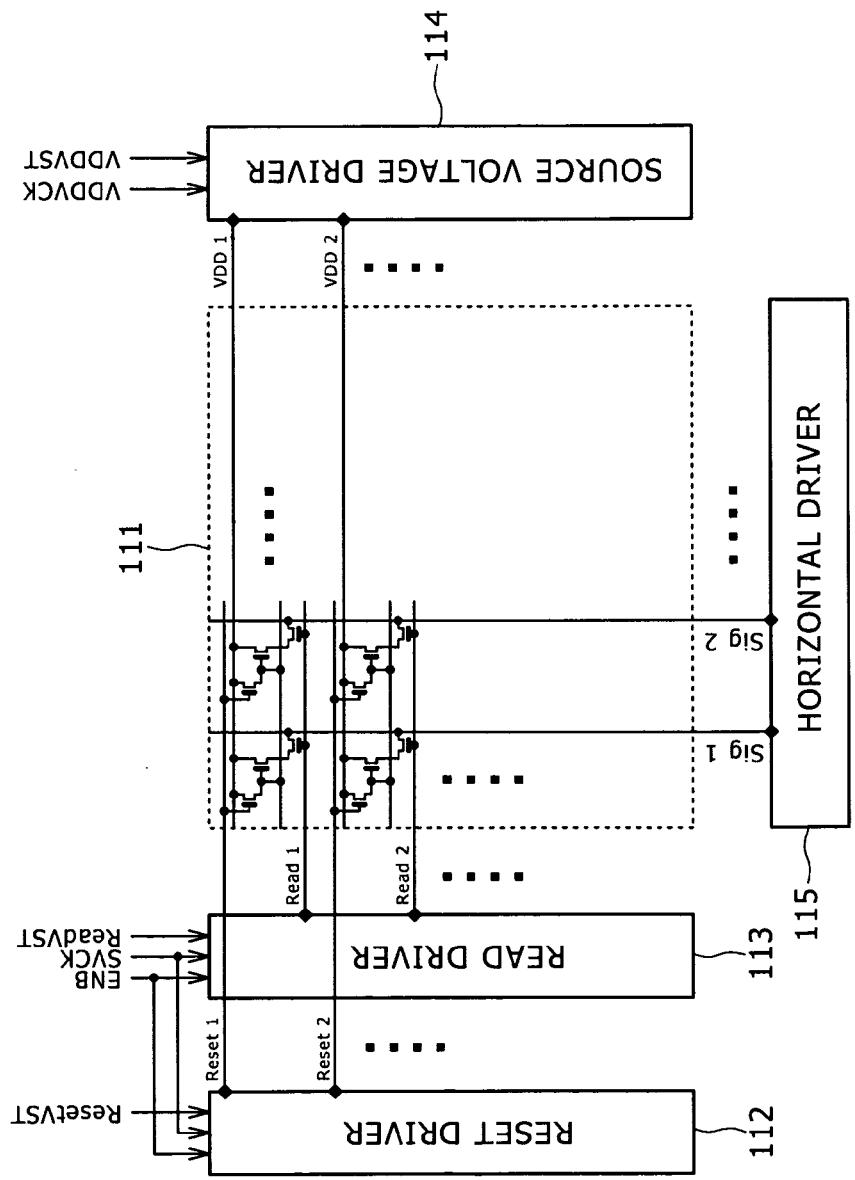
FIG. 10 is a circuit diagram illustrating an example of the schematic configuration of a conventional imaging device.

Another embodiment of the present invention will be described next. FIG. 6 is a circuit diagram illustrating an example of the schematic configuration of the imaging device according to another embodiment of the present invention. FIGS. 7 and 8 are circuit diagrams illustrating the major components included in the imaging device according to another embodiment of the present invention. FIG. 9 is a timing chart illustrating an example of the operation of the imaging device.

The imaging device described as another embodiment differs from the imaging device configured according to the above embodiment in the configuration of a sensor element section 3' and in that the imaging device includes only a reset/read/source voltage driver 7 as a vertical driver as illustrated in FIG. 6.

The sensor element section 3' includes the sensor Tr3a, capacitor 3c, source follower circuit 3d and read Tr3e formed on a low-temperature polysilicon substrate. However, the read Tr3e is not formed. The sensor Tr3a has a bias line Bias connected to its gate and a power line VDD connected to its drain. Then, the sensor Tr3a functions as an optoelectric conversion element if the voltage value applied via the bias line Bias is equal to a given threshold or less. That is, if the voltage equal to the given threshold or less is applied to the bias wiring Bias after setting the given threshold so that the sensor Tr3a has the optimal sensitivity and S/N as a sensor, the sensor Tr3a will function as an optoelectric conversion element. On the other hand, if the applied voltage value is equal to the threshold or greater, the sensor Tr3a will function as a switching TFT. Therefore, the sensor Tr3a discharges the capacitor 3c to reset the same to its initial state. That is, if the voltage equal to the given threshold or greater is applied to the bias line Bias, and at the same time if the voltage of the power line VDD is brought down to a ground (GND) potential, the sensor Tr3a will function as a reset TFT. As described above, even if the imaging device does not include the reset Tr3b as in the configuration according to the above embodiment, the sensor Tr3a will function as an optoelectric conversion element or reset TFT so long as the voltages applied to the sensor Tr3a from the bias line Bias and power line VDD are varied over time.

The supply of the voltages applied to the bias line Bias and power line VDD is controlled by the reset/read/source voltage driver 7 because the imaging device does not include the source voltage driver 5 as in the configuration according to the above embodiment. That is, the reset/read/source voltage driver 7 serves the function of a source voltage driver adapted to control the voltage applied to the sensor Tr3a, in addition to the functions of a reset driver and a read driver.

For this reason, the reset/read/source voltage driver 7 includes, as illustrated in FIG. 8, a switching circuit 7c adapted to switch the voltage applied to the power line VDD, in addition to a plurality of shift registers 7a and selector circuit 7b as in the configuration according to the above embodiment. The switching circuit 7c selects whether to set the voltage applied to the power line VDD as the ground potential, in response to the signal switching by the selector circuit 7b. It should be noted that the detailed configuration of the switching circuit 7c may be realized using publicly known techniques. Therefore, the description thereof will be omitted here.

The reset/read/source voltage driver 7 configured as described above sequentially outputs either reset signals (Reset1, 2, 3 and so on) for the reset operation or read signals (Read1, 2, 3 and so on) for the signal read out operation to the sensor element sections 3 on the respective lines in response to the start signal from the higher-level circuit as a trigger as illustrated in FIG. 9. At this time, the reset/read/source voltage driver 7 switches between the reset signals and read signals according to the status of the select signal when the start signal is supplied. More specifically, the reset/read/source voltage driver 7 outputs the reset signals if the select signal is in high (Hi) state. The same driver outputs the read signals if the select signal is in low (Low) state.

Further, the reset/read/source voltage driver 7 switches the voltage applied to the power line VDD between the ground and source potentials in response to the reset or read signal as a trigger. It should be noted that, for example, as for the first power line VDD, the reset/read/source voltage driver 7 begins to apply the source potential in response to the leading edge of the reset signal supplied to the third reset signal line as a trigger, and that the reset/read/source voltage driver 7 switches the voltage applied to the first power line VDD to the ground potential in response to the leading edge of the read signal supplied to the third read signal line as a trigger. This line-by-line delay is intended to eliminate any likelihood of overlap of signals to the same line even in the case of sequential processing on a line-by-line basis, thus providing a sufficient operating margin.

As described above, in the configuration according to another embodiment of the present invention, the reset/read/source voltage driver 7 which is the single driver circuit also serves the function of a source voltage driver, in addition to the functions of a reset driver and a read driver. Therefore, this contributes to further reduced layout space, thus making the embodiment extremely suitable for ensuring high layout efficiency.

It should be noted that although the preferred examples of the present invention have been described in the aforementioned embodiments, the present invention is not limited thereto, but may be modified as appropriate without departing from the scope of the invention.

For example, a case was taken as an example in each of the aforementioned embodiments where the imaging device included the display element sections 2 arranged in a matrix and that the sensor element section 3 was provided to be associated with each of the display element sections 2 in each of the pixel sections 1a so as to make the imaging device suitable for use as an information input/output device. However, the present invention is not limited thereto, but these sections may be arranged or disposed in any fashion. That is, the sensor element section 3 need not be provided in each of the pixel sections 1a. Further, the pixel sections 1a may be arranged in lines rather than in a matrix.

Still further, a case was taken as an example in each of the aforementioned embodiments where the selector circuit 6b in the reset/read driver 6 or the selector circuit 7b in the reset/read/source voltage driver 7 was an AND circuit supplied with the select signal (ENB2). However, the present invention is not limited thereto, but the selector circuit 6b or 7b may be optimized by logic synthesis.

Figure 13:
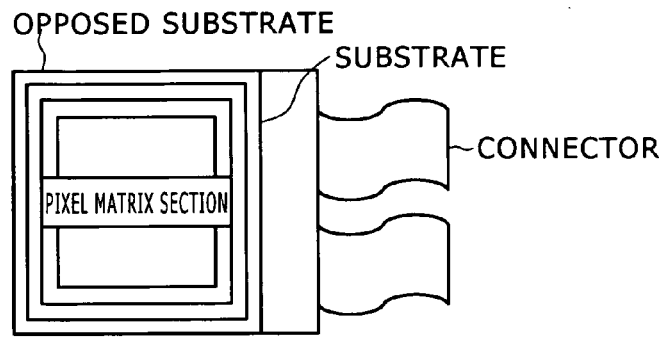
FIG. 13 is a plan view illustrating the modular configuration of a display device according to the present invention.

Still further, the imaging device (or display device) according to the present invention includes a flat device in a modular form as illustrated in FIG. 13. For example, a pixel array section is provided which includes pixels formed by integration on an insulating substrate. Each of the pixels, arranged in a matrix, includes a liquid crystal element, thin film transistor, thin film capacitance, light-receiving element and other components. An adhesive is applied to enclose the pixel array section (pixel matrix section). Finally, an opposed substrate made, for example, of glass or the like is attached to form a display module. A color filter, protective film, light-shielding film or other film may be provided as necessary on the transparent opposed substrate. For example, an FPC (flexible printed circuit) may be provided on the display module, as a connector to allow exchange of signals or other information between external apparatus and the pixel array section.

The display device described above is in the form of a flat panel and applicable as a display of electronic apparatus across all fields including a digital camera, laptop personal computer, mobile phone, video camcorder and the like. These apparatuses are designed to display an image or video of a video signal fed to or generated inside the electronic apparatus.

Specific examples of electronic apparatus having such a display device, i.e., electronic apparatus to which the present invention is applied, will be given below.

Figure 14:
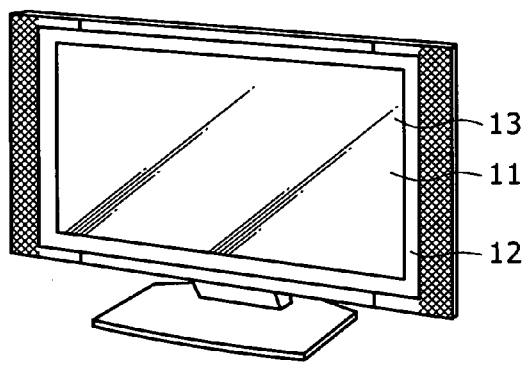
FIG. 14 is a perspective view illustrating a television set having the display device according to the present invention.

FIG. 14 illustrates a television set to which the present invention is applied. The television set includes a video display screen 11 made up, for example, of a front panel 12, filter glass 13 and other parts. The television set is manufactured by using the display device according to the present invention as the video display screen 11.

Figure 15:
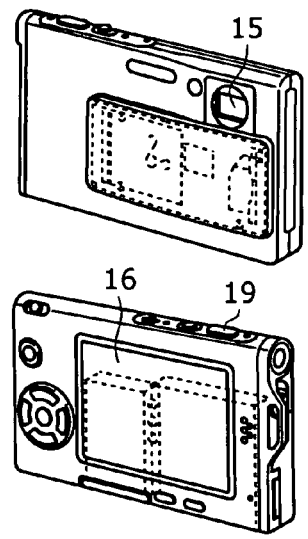
FIG. 15 is a perspective view illustrating a digital still camera having the display device according to the present invention.

FIG. 15 illustrates a digital camera to which the present invention is applied. A front view of the digital camera is shown at the top. A rear view thereof is shown at the bottom. The digital camera includes an imaging lens, flash-emitting section 15, display section 16, control switch, menu switch, shutter 19 and other parts. The digital camera is manufactured by using the display device according to the present invention as the display section 16.

Figure 16:
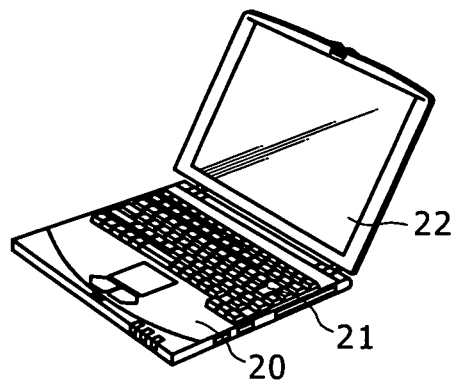
FIG. 16 is a perspective view illustrating a laptop personal computer having the display device according to the present invention.

FIG. 16 illustrates a laptop personal computer to which the present invention is applied. The laptop personal computer includes, in a main body 20, a keyboard 21 adapted to be manipulated for entry of text or other information. A main body cover thereof includes a display section 22 adapted to display an image. The laptop personal computer is manufactured by using the display device according to the present invention as the display section 22.

Figure 17:
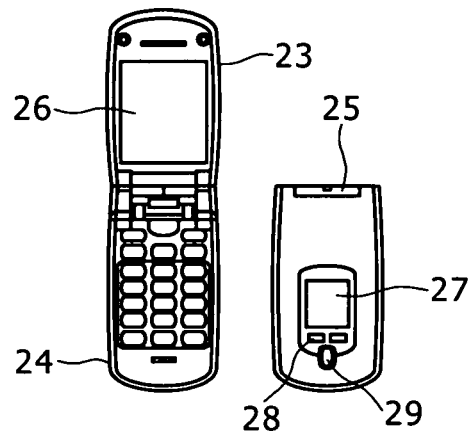
FIG. 17 is a perspective view illustrating a mobile terminal device having the display device according to the present invention.

FIG. 17 illustrates a mobile terminal device to which the present invention is applied. The mobile terminal device is shown in an open position on the left and in a closed position on the right. The mobile terminal device includes an upper enclosure 23, lower enclosure 24, connecting section (hinge section in this example) 25, display 26, subdisplay 27, picture light 28, camera 29 and other parts. The mobile terminal device is manufactured by using the display device according to the present invention as the display 26 and subdisplay 27.

Figure 18:
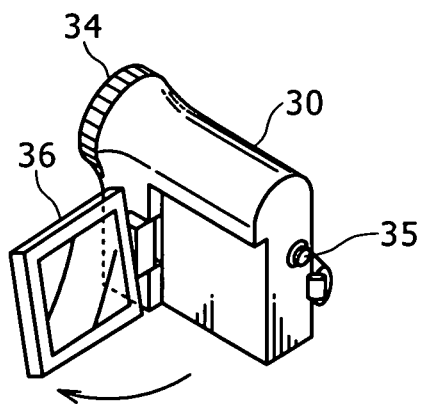
FIG. 18 is a perspective view illustrating a video camcorder having the display device according to the present invention.

FIG. 18 illustrates a video camcorder to which the present invention is applied. The video camcorder includes a main body section 30, lens 34 provided on the front-facing side surface to image the subject, imaging start/stop switch 35, monitor 36 and other parts. The video camcorder is manufactured by using the display device according to the present invention as the monitor 36.

The invention claimed is:

1. An imaging device comprising:
   imaging elements arranged in a matrix or in lines; and
   a driver circuit disposed along a vertical direction of the matrix or along the direction in which the lines extend to control the driving of the imaging elements,
   the driver circuit being configured to serve a double function of a reset driver adapted to reset the imaging elements and a read driver adapted to read out the signals from the imaging elements,
   the driver circuit being configured to receive a start signal serving as a trigger to initiate an operation and a select signal that is separate from the start signal, the select signal being configured to select the operation to be initiated, wherein the operation includes one of a reset operation and a signal read out operation, and
   the driver circuit being configured to cause the imaging elements to perform one of the reset operation and the signal read out operation according to the select signal, upon receipt of the start signal,
   wherein the start signal comprises a logical sum of a reset signal and a read signal.

2. The imaging device of claim 1, wherein
   the imaging element includes a thin film transistor and switches between two operations, one in which a photocurrent produced by light radiation is converted into a voltage and another in which a stored charge is reset to a reference level, according to the level of the voltage applied to the thin film transistor, and
   the driver circuit also serves the function of a source voltage driver adapted to control the voltage applied to the thin film transistor.

3. The imaging device of claim 1 comprising image display elements arranged in a matrix, wherein
   the imaging elements are provided to be associated with the image display elements.

4. The imaging device of claim 1, wherein the reset operation starts when the select signal is in a first state and the read out operation starts when the select signal is in a second state.

5. The imaging device of claim 1, further comprising a thin film transistor, a control terminal of the thin film transistor being connected to a bias line and a current terminal of the thin film transistor being connected to a power voltage line, wherein if a voltage value applied to the bias line is not more than given threshold value, the thin film transistor carries out an opto-electric conversion and if the voltage value applied to the power voltage line is a ground potential, the thin film transistor carries out the reset operation.

6. The imaging device of claim 5, wherein the driver circuit controls the voltage value applied to the bias line and the power voltage line.

7. A driving method of an imaging device, the imaging device including imaging elements arranged in a matrix or in lines, the driving method comprising:
   supplying a start signal serving as a trigger to initiate an operation and a select signal that is separate from the start signal, the select signal being configured to select the operation to be initiated to a driver circuit disposed along a vertical direction of the matrix or along a direction in which the lines extend to control the driving of the imaging elements, wherein the operation includes one of a reset operation and a signal read out operation;
   initiating one of the reset operation to reset the imaging elements and the signal read out operation to read out the signals from the imaging elements, upon receipt of the start signal; and
   switching the operation to be initiated between the reset operation and signal read out operation according to the status of the select signal when the start signal is supplied,
   wherein the start signal comprises a logical sum of a reset signal and a read signal.

8. The driving method according to claim 7, wherein
   the imaging element includes a thin film transistor and switches between two operations, further comprising:
       converting a photocurrent produced by light radiation into a voltage and another in which a stored charge is reset to a reference level, according to the level of the voltage applied to the thin film transistor, and
       disposing a source voltage driver within the driver circuit adapted to control the voltage applied to the thin film transistor.

9. A display device comprising:
   image display elements arranged in a matrix;
   imaging elements provided to be associated with the image display elements; and
   a driver circuit disposed along a vertical direction of the matrix or along the direction in which the lines extend to control the driving of the imaging elements,
   the driver circuit being configured to serve a double function of a reset driver adapted to reset the imaging elements and a read driver adapted to read out the signals from the imaging elements,
   the driver circuit being configured to receive a start signal serving as a trigger to initiate an operation and a select signal that is separate from the start signal, the select signal being configured to select the operation to be initiated, wherein the operation includes one of a reset operation and a signal read out operation, and
   the driver circuit being configured to cause the imaging elements to perform one of the reset operation and the signal read out operation according to the select signal, upon receipt of the start signal,
   wherein the start signal comprises a logical sum of a reset signal and a read signal.

10. The display device of claim 9, wherein
    the imaging element includes a thin film transistor and switches between two operations, one in which a photocurrent produced by light radiation is converted into a voltage and another in which a stored charge is reset to a reference level, according to the level of the voltage applied to the thin film transistor, and
    the driver circuit also serves the function of a source voltage driver adapted to control the voltage applied to the thin film transistor.

11. The display device of claim 9, wherein the reset operation starts when the select signal is in a first state and the read out operation starts when the select signal is in a second state.

12. An electronic apparatus including a display device adapted to display an image, the display device comprising:
    image display elements arranged in a matrix;
    imaging elements provided to be associated with the image display elements; and a driver circuit disposed along a vertical direction of the matrix or along the direction in which the lines extend to control the driving of the imaging elements, the driver circuit being configured to serve a double function of a reset driver adapted to reset the imaging elements and a read driver adapted to read out the signals from the imaging elements, the driver circuit being configured to receive a start signal serving as a trigger to initiate an operation and a select signal that is separate from the start signal, the select signal being configured to select the operation to be initiated, wherein the operation includes one of a reset operation and a signal read out operation, and the driver circuit being configured to cause the imaging elements to perform one of the reset operation and the signal read out operation according to the select signal, upon receipt of the start signal, wherein the start signal comprises a logical sum of a reset signal and a read signal.

13. The electronic apparatus of claim 12, wherein the imaging element includes a thin film transistor and switches between two operations, one in which a photocurrent produced by light radiation is converted into a voltage and another in which a stored charge is reset to a reference level, according to the level of the voltage applied to the thin film transistor, and the driver circuit also serves the function of a source voltage driver adapted to control the voltage applied to the thin film transistor.

14. The electronic apparatus of claim 12, wherein the reset operation starts when the select signal is in a first state and the read out operation starts when the select signal is in a second state.

* * * * *